(12) United States Patent
Lu et al.

(10) Patent No.: US 9,530,851 B1
(45) Date of Patent: Dec. 27, 2016

(54) SEMICONDUCTOR DEVICE AND MANUFACTURING METHODS THEREOF

(71) Applicant: UNITED MICROELECTRONICS CORP., Hsin-Chu (TW)

(72) Inventors: Chia-Lin Lu, Taoyuan (TW);
Chun-Lung Chen, Tainan (TW);
En-Chiuan Liou, Tainan (TW);
Chih-Wei Yang, Kaohsiung (TW);
Yu-Cheng Tung, Kaohsiung (TW);
Kun-Yuan Liao, Hsin-Chu (TW);
Feng-Yi Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/841,661

(22) Filed: Aug. 31, 2015

(30) Foreign Application Priority Data

Jul. 31, 2015  (TW) .............................. 104124822 A

(51) Int. Cl.
| | | |
|---|---|---|
| *H01L 29/78* | (2006.01) | |
| *H01L 21/8238* | (2006.01) | |
| *H01L 29/423* | (2006.01) | |
| *H01L 27/088* | (2006.01) | |
| *H01L 21/8234* | (2006.01) | |

(52) U.S. Cl.
CPC . *H01L 29/42364* (2013.01); *H01L 21/823468* (2013.01); *H01L 21/823475* (2013.01); *H01L 27/088* (2013.01)

(58) Field of Classification Search
None
See application file for complete search history.

(56) References Cited

U.S. PATENT DOCUMENTS

| 8,999,779 B2 | 4/2015 | Naczas | |
|---|---|---|---|
| 2013/0175629 A1* | 7/2013 | Chang | H01L 21/823475 |
| | | | 257/368 |
| 2015/0069473 A1 | 3/2015 | Glass | |

OTHER PUBLICATIONS

Hung, Title of Invention: Semiconductor Device and Method of Forming the Same, U.S. Appl. No. 14/614,416, filed Feb. 5, 2015.

* cited by examiner

*Primary Examiner* — Pamela E Perkins
(74) *Attorney, Agent, or Firm* — Winston Hsu; Scott Margo

(57) ABSTRACT

The present invention provides a semiconductor device, including at least two gate structures, and each gate structure includes a gate, a spacer and a source/drain region, the source/drain region disposed on two sides of the gate. A first dielectric layer is disposed on the substrate and between two gate structures, where the first dielectric layer has a concave surface, and the first dielectric layer directly contacts the spacer. A floating spacer is disposed on the first dielectric layer and on a sidewall of the gate, and at least one contact plug is disposed on the source/drain region, where the contact plug directly contacts the floating spacer.

20 Claims, 7 Drawing Sheets

US 9,530,851 B1

SEMICONDUCTOR DEVICE AND MANUFACTURING METHODS THEREOF

BACKGROUND OF THE INVENTION

1. Field of the Invention

The present invention relates to a semiconductor device and a method of forming the same, and more particularly to a semiconductor device having a floating spacer and a method of forming the same.

2. Description of the Prior Art

The critical dimension (CD) in semiconductor processes has become ever finer with the increasing miniaturization of semiconductor devices. Along with the continuously shrinking of this dimension, the integrated process of forming a semiconductor device having a metal gate also faces more challenges and limitations.

As the semiconductor industry progresses into nanometer technology process nodes in pursuit of highly integrated and high-speed operation, current techniques utilize miniaturized through holes and inter-layer dielectric layers to form a multilayered an interconnected wiring structure. The method of forming such interconnected wiring structure includes forming a through hole in a dielectric layer, and then sequentially forming various films in the through hole, such as an adhesive layer, a barrier layer and a conductive layer. When the CD of the semiconductor device goes below 14 nanometers (nm), the current techniques can no longer define the position of the through hole, as well as controlling the CD thereof. If a dimensional shift or a dislocated through hole occurs, this can easily lead to serious defects to other elements, thereby affecting the entire performance of the semiconductor device.

For these reasons, current semiconductor devices having metal gates still meet practical requirements, but the current approach for forming such semiconductor device also encounters numerous problems. Therefore, how to improve the current issues while increasing the performance of the device has become an important task in this field.

SUMMARY OF THE INVENTION

The present invention provides a semiconductor device, comprising at least two gate structures disposed on a substrate, each gate structure comprising: a gate, a spacer, and a source/drain region, disposed on two sides of the gate. In addition, the semiconductor device comprises a first dielectric layer disposed on the substrate and between two gate structures, wherein the first dielectric layer has a concave surface, and the first dielectric layer directly contacts the spacer. A floating spacer is disposed on the first dielectric layer, and directly contacts the spacer, and at least one contact plug is disposed on the source/drain region.

The present invention further provides a method for forming a semiconductor device, comprising: firstly, at least two gate structures are formed on a substrate, each gate structure comprising: a gate, a spacer, and a source/drain region, disposed on two sides of the gate. Next, a first dielectric layer is formed on the substrate and between two gate structures, wherein the first dielectric layer has a concave surface, and the first dielectric layer directly contacts the spacer. Afterwards, a floating spacer is formed on the first dielectric layer, and directly contacts the spacer, and at least one contact plug is formed on the source/drain region.

The semiconductor device of the present invention includes the floating spacer which is directly disposed on a top portion of a sidewall of the gate structure. The floating spacer has an etching selectivity relative to the dielectric layer such that the floating spacer may achieve the purpose of protecting the gate electrode. Simultaneously, disposing the floating spacer is sufficient to assist in defining the forming position of the contact opening, which improves the accuracy of the formed device as well as simplifying the forming process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
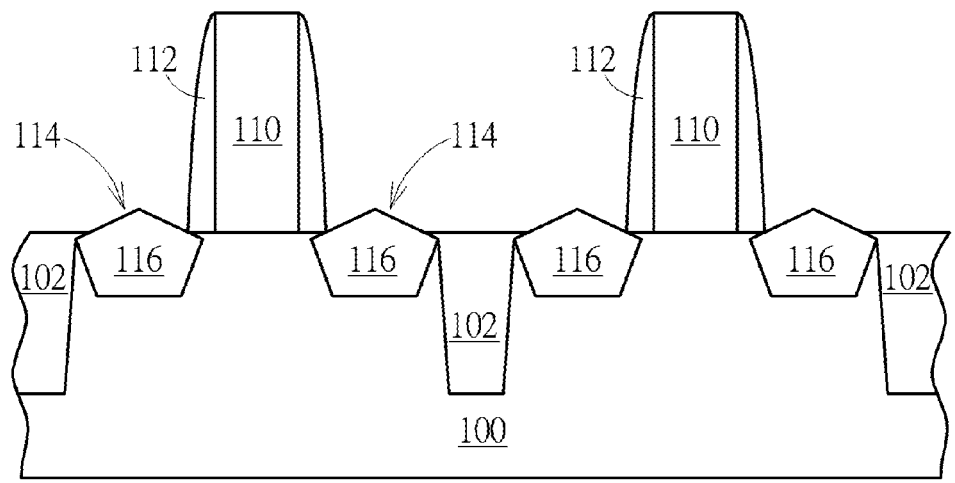
FIG. 1 to FIG. 7 are schematic diagrams illustrating a forming method of a semiconductor device according to a first embodiment of the present invention.

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

FIGS. 1-7 illustrate a forming method of a semiconductor device according to a first embodiment of the present invention. First of all, a substrate 100 is provided. The substrate 100 may include a semiconductor substrate, for example, a silicon substrate, an epitaxial silicon substrate, a silicon germanium substrate, a silicon carbide substrate or a silicon-on-insulator (SOI) substrate, or may include a non-semiconductor substrate such as a glass substrate, but this is not limited thereto. Moreover, at least one shallow trench isolation (STI) 102 may be previously formed in the substrate 100 to identify each active area.

The substrate 100 also includes at least two sacrificial gate structures 110 disposed thereon, the sacrificial gate structure 110 made of polysilicon, but not limited thereto. The spacers 112 are disposed on two sides of each sacrificial gate structure 110, each spacer 112 may be a monolayer structure or a multiple layer structure, and the present invention is not limited thereto. Next, a plurality of source/drain (S/D) regions 114 are formed in the substrate 100 on two sides of each sacrificial gate structure 110, or furthermore, an epitaxial layer 116 is formed and disposed within each S/D region 114. In this case, the epitaxial layer 116 is therefore used as the source/drain regions of the gate structures which are formed in the following steps. The epitaxial layer 116 may include a silicon-germanium epitaxial layer suited for a PMOS transistor, or a silicon-carbide epitaxial layer suited for an NMOS transistor, depending upon the electrical properties of the Multi-gate MOSFET. The processes mentioned above are well known to those skilled in the art, and will not be described in detail here.

The present invention may also include further forming a contact etching stop layer (CESL, not shown) on the substrate 100 to cover the sacrificial gate structure 110 and the epitaxial layer 116. The CESL may include a monolayer structure or a multilayer structure, thereby providing required compressive stress or stretching stress to the gate structure formed in the following steps. In one embodiment, the CESL may also be omitted. Also, in another embodiment, the present invention may include forming a light doped drain (LDD) region (not shown in the drawings) in the substrate 100 before the spacer is formed according to practical requirements.

Figure 2:
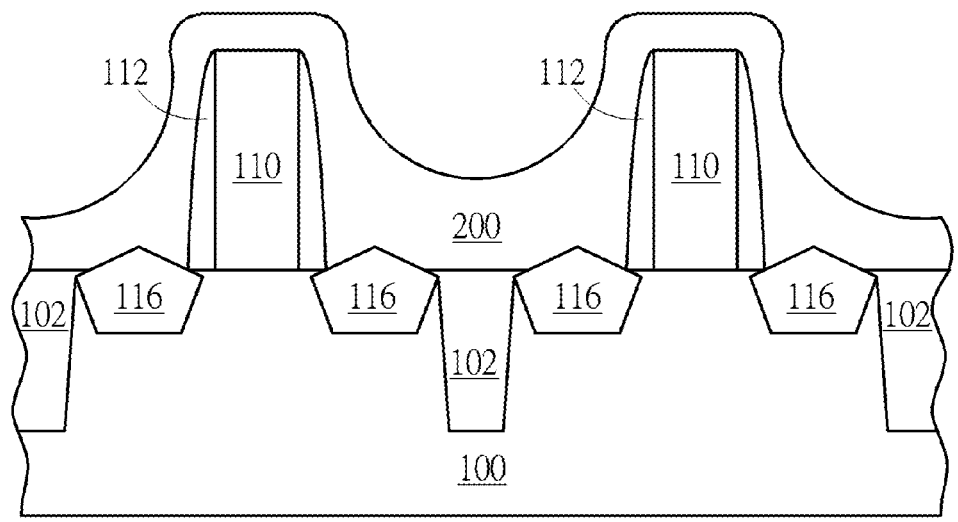
Figure 3:
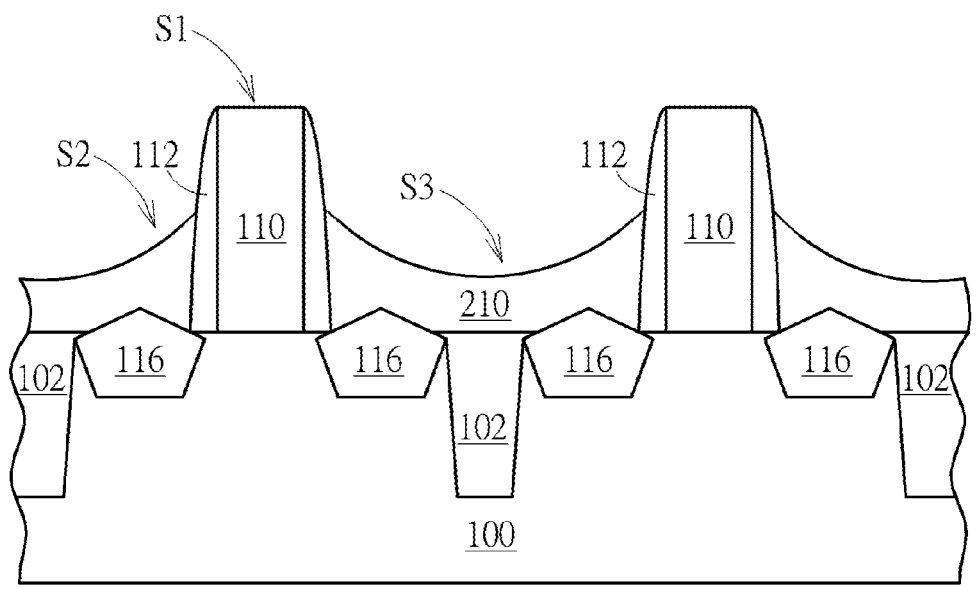

As shown in FIGS. 2-3, a first dielectric layer 200 is formed on the substrate 100, covering the sacrificial gate structures 110 and the spacers 112. It is noteworthy that the first dielectric layer 200 preferably includes the material with high gap fill ability, and after the first dielectric layer 200 is formed, there is no any planarization process is performed to the first dielectric layer 200, so the first dielectric layer 200 will cover the sacrificial gate structures 110 and the spacers 112 conformally. Next, a thermal treatment can be selectively performed, so as to cure the first dielectric layer 200.

As shown in FIG. 3, an etching back process such as a dry etching process, a wet etching or a sequentially performed dry and wet etching process, is carried out on the first dielectric layer 200, thereby removing a portion of the first dielectric layer 200 to form a first dielectric layer 210 and to expose a portion of the sacrificial gate structure 110. In other words, the first dielectric layer 210 only covers a bottom portion of the sacrificial gate structure 110. In addition, a top surface S1 of the first dielectric layer 210 is lower than a top surface S2 of the sacrificial gate structure 110, as shown in FIG. 3. It is noteworthy as mentioned above, that the first dielectric layer 200 is conformally formed on the sacrificial gate structure 110 and the spacer 112, so after the etching back process is performed, a curved surface S3 is formed between the two sacrificial gate structures 110. In this embodiment, the curved surface S3 is preferably a concave surface, in other words, the curved surface does not includes a flat surface. Besides, in the present embodiment, the first dielectric layer 210 is disposed on the source/drain region 114 (or on the epitaxial layer 116), such that the first dielectric layer 210 only contacts a bottom portion of a sidewall of the spacer 112; however, the present invention is not limited thereto. In another embodiment, the first dielectric layer may directly be formed on the CESL and directly contacts a bottom portion of a sidewall of the CESL, while the CESL is formed.

Figure 4:
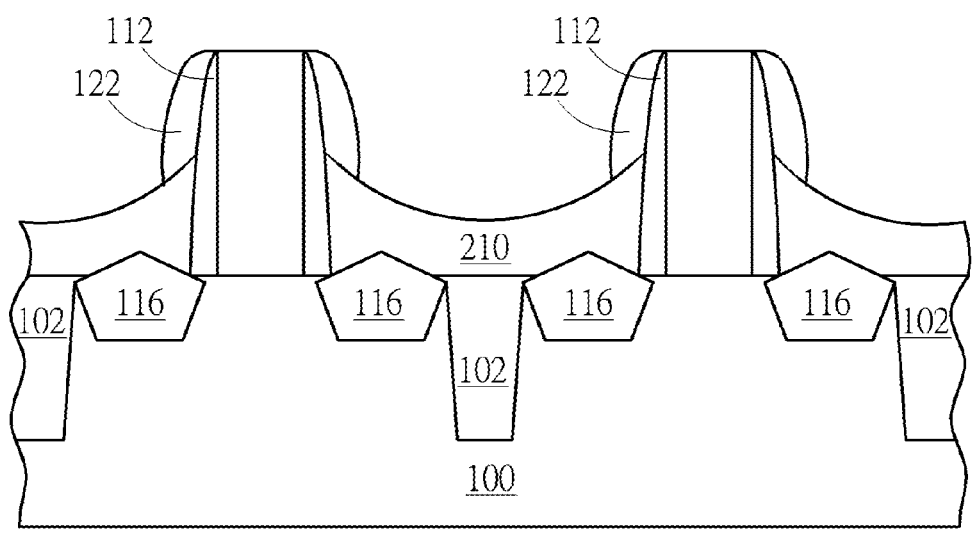

As shown in FIG. 4, a floating spacer 122 is formed on the sacrificial gate structure 110 after the etching back process is performed on the first dielectric layer. The method of forming the floating spacer 122 may include entirely forming a floating spacer material layer (not shown), wherein after the first dielectric layer 210 is formed by the etching back process, the floating spacer material layer is formed entirely to cover the first dielectric layer 210, the sacrificial gate structure 110 and the spacer 112; and partially removing the floating spacer material layer by using an etching process, such as a dry etching process, to form a floating spacer 122 as shown in FIG. 4. The floating spacer material layer may include a material having an etching selectivity relative to the first dielectric layer 210, such as silicon nitride, but is not limited thereto. The floating spacer 122 is formed on the first dielectric layer 210 so that the floating spacer 122 only contacts a top portion of the sidewall of the spacer 122. Thus, a portion of the first dielectric layer 210 will be sandwiched between the floating spacer 122, the sacrificial gate structure 110 and the epitaxial layer 116, as shown in FIG. 4.

Figure 5:
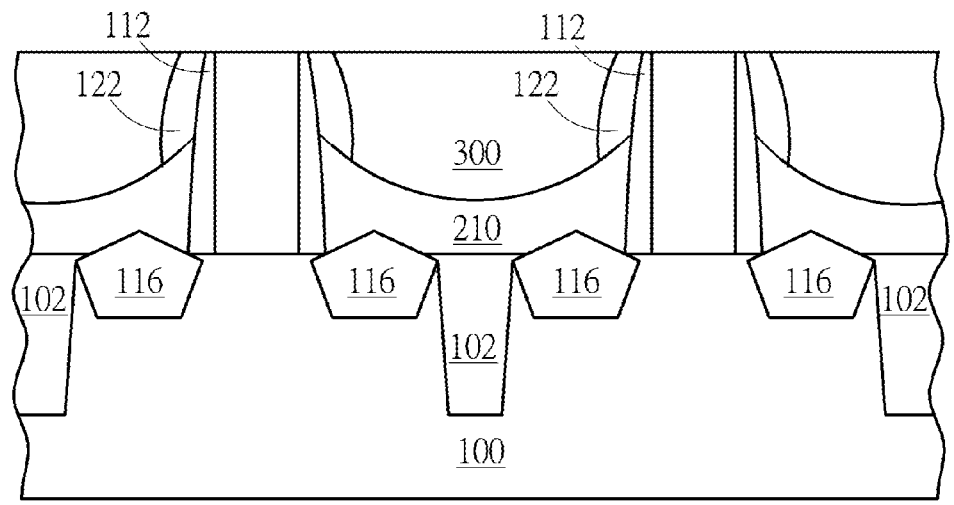

As shown in FIG. 5, a second dielectric layer 300 is formed entirely on the substrate 100, covering the sacrificial gate structure 110, the spacer 112 and the first dielectric layer 210. After the floating spacer 122 is formed, a second dielectric material layer (not shown in the drawings) is entirely formed to cover the substrate 100 and the first dielectric layer 210. In one embodiment, the second dielectric material layer may include the same material as the first dielectric layer 210, but is not limited thereto. Another planarization process (such as a CMP process or an etching process) may be performed further to form a second dielectric layer 300 as shown in FIG. 5.

Figure 6:
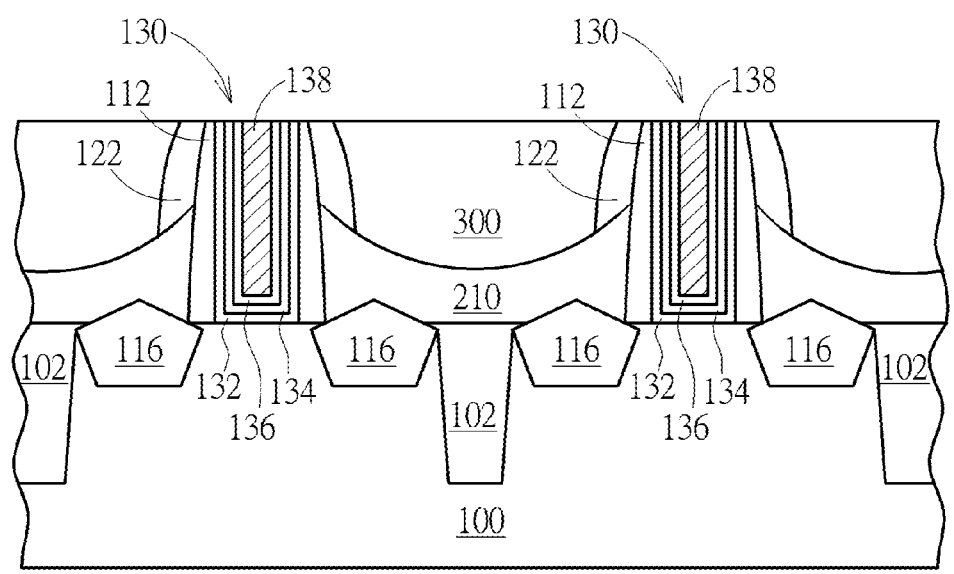

Afterwards, a replacement metal gate (RMG) process is performed, to remove each sacrificial gate structures 110, and at least one gate trench (not shown) is therefore formed. Next, a high-k gate dielectric layer 132, a work function layer 134, a barrier layer 136 and a gate electrode 138 are then filled in the gate trench in sequence, so as to form a gate structure 130. As shown in FIG. 6, the gate structure 130 includes the high-k gate dielectric layer 132, the work function layer 134, the barrier layer 136, the gate electrode 138 and the spacer 112 mentioned above. In a preferred embodiment, the high-k gate dielectric layer 132 may include rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but this is not limited thereto. The work function metal layer 134 and the barrier layer 136 may be formed through a physical vapor deposition (PVD) process, wherein the work function metal layer 134 may include a P type work function metal, such as a nitride of nickel (Ni), tungsten (W), molybdenum (Mo), tantalum (Ta), or titanium (Ti), or an N type work function metal, such as titanium aluminides (TiAl), aluminum zirconium (ZrAl), aluminum tungsten (WAl), aluminum tantalum (TaAl) or aluminum hafnium (HfAl); and the barrier layer 136 may include Ti/titanium nitride (TiN) or Ta/tantalum nitride (TaN), but is not limited thereto. People skilled in the art should realize that the gate structure 130 of the present invention is not limited to being formed through the above-mentioned steps and materials, and may include other processes or materials.

In another case, after the gate structure 130 is formed, a top portion of each gate structure 130 can be selectively removed, so as to form a recess on the top of each gate structure 130, and a dielectric layer is then filled in the recess, to form a cap layer (not shown) on the top of each gate structure 130. The cap layer mentioned above can protect the top portion of each gate structure 130, preventing each gate structure 130 from shorting with other elements such as metal plugs. The structure mentioned here should be within the scope of the present invention.

Figure 7:
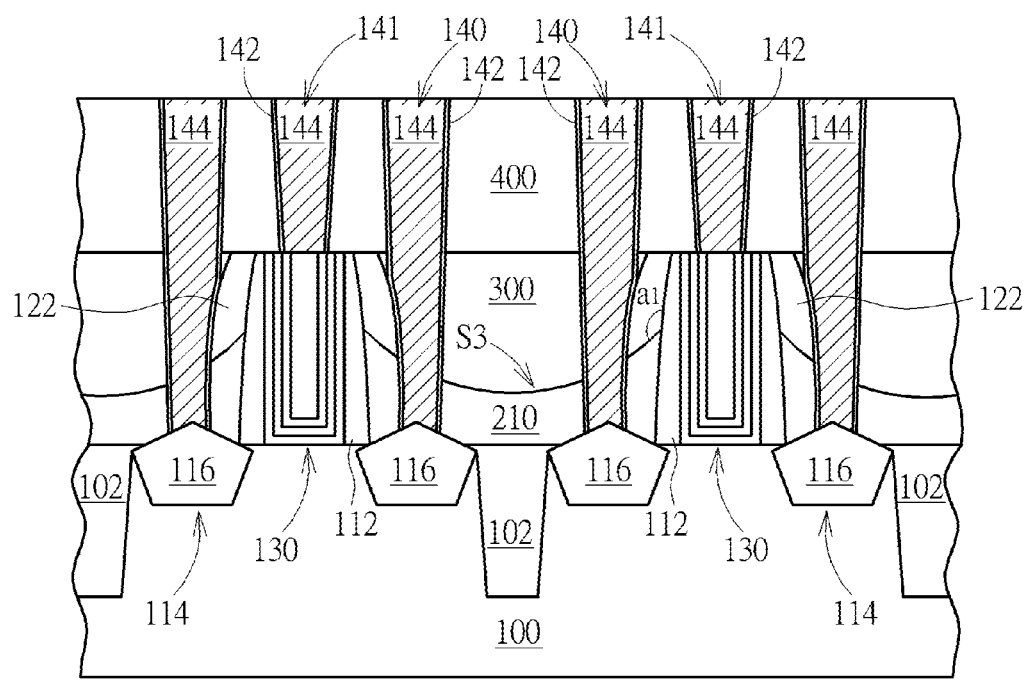

Finally, as shown in FIG. 7, a third dielectric layer 400 is formed on the first dielectric layer 210 and on the second dielectric layer 300. Next, a plurality of contact plugs 140, 141 are formed in the first dielectric layer 210, the second dielectric layer 300 and the third dielectric layer 400, to electrically connect the source/drain region 114 (the epitaxial layer 116) and the gate structure 130. The contact plugs 140, 141 may include an adhesive layer 143a and a conductive layer 143b, wherein the adhesive layer 142 may include Ti, Ta, TiN, TaN or a composite of above-mentioned materials, and the conductive layer 144 may include W, copper (Cu) or aluminum (Al), but is not limited thereto. The method of forming the contact plugs 140, 141 may include sequentially etching the third dielectric layer 400, the second dielectric layer 300 and the first dielectric layer 210 to form a plurality of contact openings (not shown in the drawings) in the third dielectric layer 400, the second dielectric layer 300 and the first dielectric layer 210, and then sequentially forming the adhesive layer 142 and the conductive layer 144 in each contact opening. It is noted that, while forming the contact openings, the etching process will not damage the floating spacer due to the etching selectivity between the floating spacer 122 and the dielectric layers 210, 300 and 400, but will downwardly etch the dielectric layers 210,300 and 400 along the outer sidewall of the floating spacer 122, thereby forming the contact opening adjacent to the floating spacer 122. The floating spacer 122 can increase the process window of the contact opening, so as to achieve the purpose of protecting the gate structure 130. Furthermore, after the contact plugs 140 are formed, a portion of the first dielectric layer 210 is sandwiched between the floating spacer 122, the gate structure 130 and the contact plug 140.

According to the first preferred embodiment of the present invention, as shown in FIGS. 6-7, the semiconductor device comprises at least two gate structures 130 disposed on a substrate 100, each gate structure 130 comprises a gate electrode 138, a spacer 112 and a source/drain region 114, the source/drain region 114 disposed on two sides of the gate electrode 138, a first dielectric layer 210 disposed on the substrate 100 and between two gate structures 130, wherein the first dielectric layer 210 has a concave surface S3. In addition, the first dielectric layer 210 directly contacts the spacer 112, a floating spacer 122 is disposed on the first dielectric layer 210 and directly contacts the spacer 112, and at least one contact plug 140 is disposed on the source/drain region 114.

The semiconductor device of the present invention further comprises the following features:

In one embodiment of the present invention, an angle a1 is disposed between the concave surface S3 of the first dielectric layer 210 and the spacer 112 of the gate structure 130, and the angle a1 is larger than 90 degrees.

In one embodiment of the present invention, the floating spacer 122 only contacts an upper portion of the spacer 112.

In one embodiment of the present invention, further comprising a second dielectric layer 300 disposed on the first dielectric layer 210, wherein the contact plug 140 is disposed within the first dielectric layer 210 and the second dielectric layer 300. In addition, a top surface of the second dielectric layer 300 and a top surface of the gate structure 130 are on a same level.

In one embodiment of the present invention, a portion of the first dielectric layer 210 is disposed between the contact plug 140 and the gate structure 130.

In one embodiment of the present invention, a top surface of the gate structure 130 and a top surface of the floating spacer 122 are on a same level.

In one embodiment of the present invention, the structure further comprises a shallow trench isolation (STI) 102 disposed in the substrate 100 and between two gate structures 130, and the first dielectric layer 210 covers the STI 102.

In one embodiment of the present invention, the structure further comprises at least one epitaxial layer 116 disposed within the source/drain region 114.

In one embodiment of the present invention, the contact plug 140 directly contacts the floating spacer 122.

Figure 8:
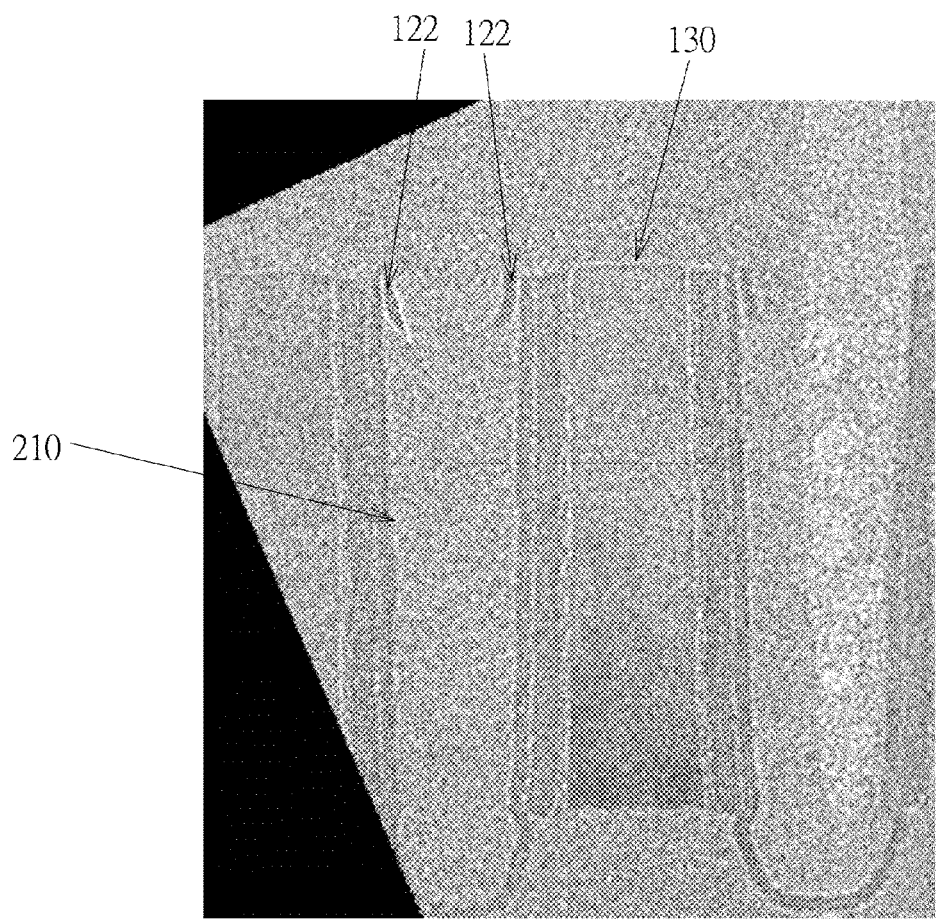
FIG. 8 shows a transmission electron microscopy (TEM) image of a semiconductor device according to the first preferred embodiment of the present invention.

FIG. 8 shows a transmission electron microscopy (TEM) image of a semiconductor device according to the first preferred embodiment of the present invention. As shown in FIGS. 7-8, the semiconductor device of the present invention has a floating spacer 122 formed on the sidewall of the gate structure 130 and being disposed on a first dielectric layer 210 being lower than the gate structure 130, and only contacting the top portion of the sidewall of the gate structure 130, to achieve the purpose of protecting the gate electrode. By disposing the floating spacer, the forming position of the contact opening can be defined, which improves the accuracy of the formed device, as well as to simplify the forming process. People skilled in the art will realize that the semiconductor device is not limited to being formed via the above-mentioned processes, and may also include other processes.

The following description will detail other different embodiments or variations of the forming method of the semiconductor device of the present invention. To simplify the description, the following description will only detail dissimilarities between the different embodiments and identical features will not be described. In order to compare the differences between the embodiments easily, identical components in each of the following embodiments are marked with identical symbols.

Figure 9:
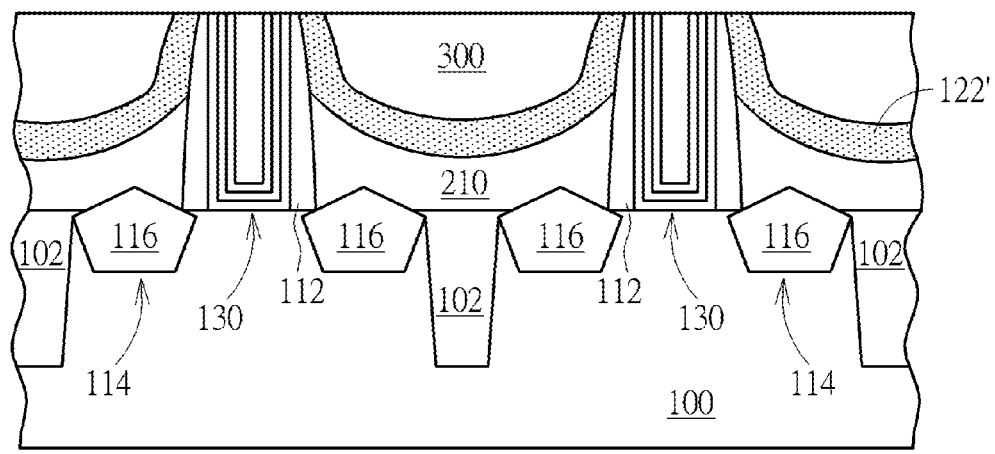
FIG. 9 is a schematic diagram illustrating a forming method of a semiconductor device according to a second embodiment of the present invention.

Please refer to FIG. 9, which containing a schematic diagram illustrating a forming method of a semiconductor device according to a second embodiment of the present invention. In this embodiment, the process is the same as that of shown in FIGS. 1-3, and will not be described again. The difference between this embodiment and the first preferred embodiment is that after the curved surface S3 on the first dielectric layer 210 is formed, a material layer 122' is entirely formed on the first dielectric layer 210, wherein the material of the material layer 122' is identical to the material of the floating spacer 122. At this step, the floating spacer has not been formed by etching the material 122' yet, and the material layer 122' is then etched until the contact plugs are formed, so as to form the floating spacers simultaneously. The following steps are similar to that of in the first preferred embodiment mentioned above, such as forming the second dielectric layer 300, performing the CMP process, performing the RMG process, forming the third dielectric layer and forming a plurality of contact plugs, and these processes will not be described again. The final structure of this embodiment is similar to the structure shown in FIG. 7, but the material 122' is also disposed on the curved surface between two gate structures, the difference will not be described in figures.

Figure 10:
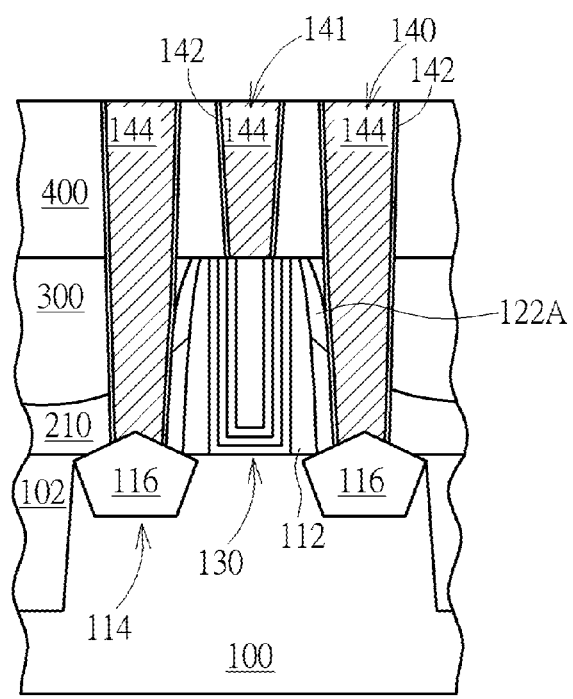
FIG. 10 is a schematic diagram illustrating a forming method of a semiconductor device according to a third embodiment of the present invention.
Figure 11:
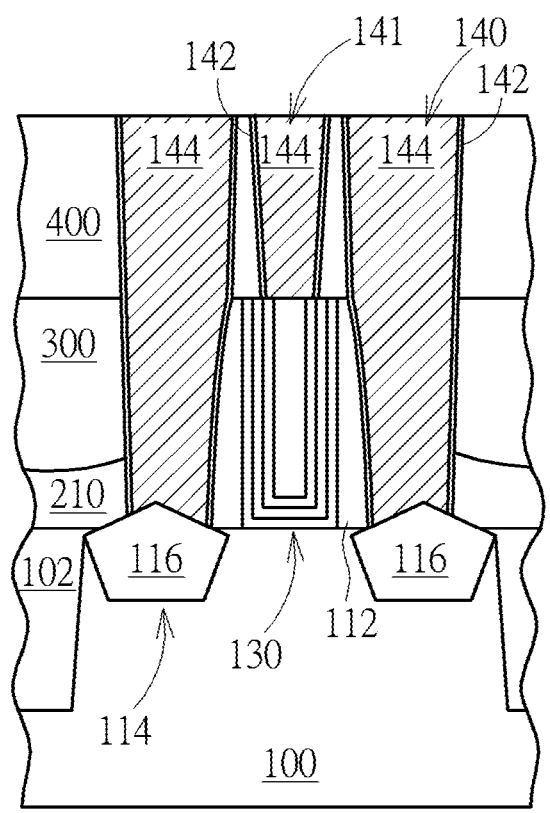
FIG. 11 is a schematic diagram illustrating a forming method of a semiconductor device according to a fourth embodiment of the present invention.

In another embodiment of the present invention, during the process for forming the contact plugs 140, since the spacers should also be partially etched, as shown in FIG. 10, which contains a schematic diagram illustrating a forming method of a semiconductor device according to a third embodiment of the present invention, after the contact plugs 140 are formed, a plurality of floating spacers 122A are thinner than the floating spacers 122 shown in FIG. 7 due to the floating spacers 122A being etched more. As shown in FIG. 11, which contains a schematic diagram illustrating a forming method of a semiconductor device according to a fourth embodiment of the present invention, after the contact plugs 140 are formed, the floating spacers are etched and consumed completely, so there are no floating spacers existed in this embodiment. In this case, each contact plug directly contacts the spacers 112 or directly contacts the CESL while CESL is formed, it should also be within the scope of the present invention.

In summary, the present invention provides a semiconductor device having a floating spacer and a method of forming the same. In the semiconductor device of the present invention, since the floating spacer is directly disposed on a portion of a sidewall of the gate structure and has an etching selectivity relative to the dielectric layer, the floating spacer can achieve the purpose of protecting the gate electrode. Disposing the floating spacer can also assist in defining the forming position of the contact opening, so as to improve the accuracy of the formed device, as well as simplifying the forming process.

Although the aforementioned embodiments are exemplified as a "gate-last" process and a "high-k first" process, in another embodiment the semiconductor device of the present invention may also be formed through a "gate-first" process or a "high-k last" process. For example, the present invention may include removing the high-k gate dielectric layer before the work function metal layer is formed, and then forming another high-k gate dielectric layer, the work function metal layer and the metal gate sequentially in the gate trench. Thus, the high-k gate dielectric layer disposed in the gate trench may also include the U-shaped cross-section (not shown in the drawings). Furthermore, although the aforementioned embodiments are mainly applied to a method of forming a planar transistor, the present invention may also be used in a method of forming other non-planar transistors, such as a fin field-effect transistor (finFET).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    at least two gate structures disposed on a substrate, each gate structure comprising:
        a gate;
        a spacer; and
        a source/drain region, disposed on two sides of the gate;
    a first dielectric layer disposed on the substrate and between two gate structures, wherein the first dielectric layer has a concave surface, and the first dielectric layer directly contacts the spacer;
    a floating spacer disposed on the first dielectric layer, and directly contacting the spacer; and
    at least one contact plug, disposed on the source/drain region.

2. The semiconductor device of claim 1, wherein an angle disposed between an outer surface of the first dielectric layer and the spacer of the gate structure, and the angle is larger than 90 degrees.

3. The semiconductor device of claim 1, wherein the floating spacer only contacts an upper portion of the spacer.

4. The semiconductor device of claim 1, further comprising a second dielectric layer disposed on the first dielectric layer, wherein the contact plug is disposed within the first dielectric layer and the second dielectric layer.

5. The semiconductor device of claim 4, wherein a top surface of the second dielectric layer and a top surface of the gate structure are on a same level.

6. The semiconductor device of claim 1, wherein a portion of the first dielectric layer is disposed between the contact plug and the gate structure.

7. The semiconductor device of claim 1, wherein a top surface of the gate structure and a top surface of the floating spacer are on a same level.

8. The semiconductor device of claim 1, further comprising a shallow trench isolation (STI) disposed in the substrate and between two gate structures, and the first dielectric layer covers the STI.

9. The semiconductor device of claim 1, further comprising at least one epitaxial layer disposed within the source/drain region.

10. The semiconductor device of claim 1, wherein the contact plug directly contacts the floating spacer.

11. A method for forming a semiconductor device, comprising:
    forming at least two gate structures on a substrate, each gate structure comprising:
        a gate;
        a spacer; and
        a source/drain region, disposed on two sides of the gate;
    forming a first dielectric layer on the substrate and between two gate structures, wherein the first dielectric layer has a concave surface, and the first dielectric layer directly contacts the spacer;
    forming a floating spacer on the first dielectric layer, and directly contacting the spacer; and
    forming at least one contact plug on the source/drain region.

12. The method of claim 11, wherein an angle disposed between an outer surface of the first dielectric layer and the spacer of the gate structure, and the angle is larger than 90 degrees.

13. The method of claim 11, wherein the floating spacer only contacts an upper portion of the spacer.

14. The method of claim 11, further comprising forming a second dielectric layer on the first dielectric layer, wherein the contact plug is disposed within the first dielectric layer and the second dielectric layer.

15. The method of claim 14, wherein a top surface of the second dielectric layer and a top surface of the gate structure are on a same level.

16. The method of claim 11, wherein a portion of the first dielectric layer is disposed between the contact plug and the gate structure.

17. The method of claim 11, wherein a top surface of the gate structure and a top surface of the floating spacer are on a same level.

18. The method of claim 11, further comprising forming a shallow trench isolation (STI) in the substrate and between two gate structures, and the first dielectric layer covers the STI.

19. The method of claim 11, further comprising forming at least one epitaxial layer within the source/drain region.

20. The method of claim 11, wherein the contact plug directly contacts the floating spacer.

* * * * *